United States Patent [19]

Lahti et al.

[11] Patent Number: 5,610,601
[45] Date of Patent: Mar. 11, 1997

[54] MULTI-PURPOSES KEYBOARD INTERFACE

[75] Inventors: Gregg D. Lahti, Chandler; Charles R. Rimpo, Mesa; Franklyn H. Story, Chandler, all of Ariz.

[73] Assignee: VLSI Technology, Inc., San Jose, Calif.

[21] Appl. No.: 532,343

[22] Filed: Sep. 19, 1995

[51] Int. Cl.[6] .................... H03K 17/94; H03M 11/00
[52] U.S. Cl. ................ 341/22; 341/20; 341/26; 364/189; 345/168
[58] Field of Search .................... 341/22, 20, 26; 364/189, 709.1; 345/168, 172

[56] References Cited

U.S. PATENT DOCUMENTS

| | | | |
|---|---|---|---|
| 3,952,289 | 4/1976 | Baligant | 340/172.5 |
| 4,942,606 | 7/1990 | Kaiser et al. | 380/4 |
| 5,280,283 | 1/1994 | Raasch et al. | 364/189 |
| 5,450,080 | 9/1995 | Irwin | 341/26 |
| 5,459,462 | 10/1995 | Venkidu et al. | 341/22 |
| 5,486,824 | 1/1996 | Kinerk et al. | 364/189 |

Primary Examiner—Thomas J. Mullen, Jr.
Assistant Examiner—Timothy Edwards, Jr.
Attorney, Agent, or Firm—LaValle D. Ptak

[57] ABSTRACT

A multi-purpose keyboard controller includes a matrix keyboard control circuit, a serial keyboard control circuit, a PC/AT port control circuit, and an external interface for RTC control. These control circuits are coupled in parallel with the interface logic of the computer system and use the built-in SMI interrupt mechanism of the computer system for reading and writing the keyboard or capturing keypress events. Software BIOS setup is employed to select one of the keyboard control circuits for utilization with the particular personal computer with which the system is employed. The interrupt scheme used by the keyboard interface uses SMI interrupts to the processor and SMI based software routines to read and write the values to and from the keyboard, thereby eliminating the need for dedicating a special hardware interrupt level; so that the system remains compatible with the DOS PC/AT Port 60/64h software interface.

7 Claims, 5 Drawing Sheets

KBDCTL- KEYBOARD CONFIGURATION (R/W)

| CONFIG PORT | D15 | D14 | D13 | D12 | D11 | D10 | D9 | D8 |
|---|---|---|---|---|---|---|---|---|
| KBDCTL | ENKBD[2:0] | | | R | IRQST | ENKDN | ENKUP | SKBD |
| POR VALUE | 0 | 0 | 0 | 0 | 0 | 0 | 0 | 0 |
| | D7 | D6 | D5 | D4 | D3 | D2 | D1 | D0 |
| | KBOUT[7:0] | | | | | | | |
| | 0 | 0 | 0 | 0 | 0 | 0 | 0 | 0 |

| BIT | NAME | FUNCTION |
|---|---|---|
| 15:13 | ENKBD[2:0] | ENABLES THE KEYBOARD INTERFACE AND SELECTS OPTION<br>000=KEYBOARD INTERFACE DISABLED (DEFAULT)<br>001=MATRIX KEYBOARD INTERFACE ENABLED<br>010=INTERFACE CONFIGURED FOR EXTERNAL SCANNER SUPPORT ON X-BUS<br>011=INTERFACE CONFIGURED FOR SERIAL KEYBOARD INTERFACE<br>100=KEYBOARD INTERFACE DISABLED AND EXTERNAL RTC INTERFACE ENABLED<br>101= RESERVED<br>110 = INTERFACE CONFIGURED FOR EXTERNAL SCANNER SUPPORT ON X-BUS AND EXTERNAL RTC INTERFACE ENABLED<br>111= INTERFACE CONFIGURED FOR SERIAL KEYBOARD INTERFACE AND EXTERNAL RTC INTERFACE ENABLED |
| 12 | R | RESERVED: THIS BIT ALWAYS RETURNS '0. |
| 11 | IRQST | CONTROLS THE CURRENT STATE OF THE INTERRUPT OUTPUT. |
| 10 | ENKDN | ENABLES KEYBOARD STATUS/SMI GENERATION IF ENKBD=001 AND A RISING EDGE OF KEYDWN IS DETECTED. |
| 9 | ENKUP | ENABLES KEYBOARD STATUS/SMI GENERATION IF ENKBD=001 AND A FALLING EDGE OF KEYDWN IS DETECTED. |
| 8 | SKBD | SERIAL INTERFACE IN PC/AT (SKBD=0) OR PC/XT (SKBD=1) MODE. |
| 7:0 | KBOUT[7:0] | OUTPUT DATA TO KEYBOARD MATRIX |

FIG. 3

KBSR-KEYBOARD SHIFT REGISTER (R/W)

| CONFIG PORT | D15 | D14 | D13 | D12 | D11 | D10 | D9 | D8 |
|---|---|---|---|---|---|---|---|---|
| FBSR | R | R | R | R | R | KBSR[10:8] | | |
| POR VALUE | 0 | 0 | 0 | 0 | 0 | 0 | 0 | 0 |
| | D7 | D6 | D5 | D4 | D3 | D2 | D1 | D0 |
| | KBSR[7:0] | | | | | | | |
| | 0 | 0 | 0 | 0 | 0 | 0 | 0 | 0 |

| BIT | NAME | FUNCTION |
|---|---|---|
| 15:11 | R | RESERVED: THESE BITS ALWAYS RETURN 0s. |
| 10:0 | KBSR[10:0] | SERIAL WORD DATA TO/FROM SERIAL KEYBOARD INTERFACE:<br>BIT 10 = STOP BIT = 1<br>BIT 9 = PARITY = ODD<br>BITS 8.1 = B[7:0]<br>BIT 0 = START BIT = 0 |

FIG. 5

KBDSTAT-KEYBOARD STATUS (R-O)

| CONFIG PORT | D15 | D14 | D13 | D12 | D11 | D10 | D9 | D8 |
|---|---|---|---|---|---|---|---|---|
| KBDSTAT | R | WRPORT | R | KEYDWN | R | R | R | R |
| POR VALUE | 0 | 0 | 0 | 0 | 0 | 0 | 0 | 0 |
|  | D7 | D6 | D5 | D4 | D3 | D2 | D1 | D0 |
|  | SIDLE | SRTO | STTO | SRCV | R | R | R | R |
|  | 1 | 0 | 0 | 0 | 0 | 0 | 0 | 0 |

| BIT | NAME | FUNCTION |
|---|---|---|
| 15 | R | RESERVED: THIS BIT ALWAYS RETURNS 0. |
| 14 | WRPORT | INDICATES THE STATE OF SXA2 WHEN A KEYBOARD WRITE TRAP WAS GENERATED. 0 = A WRITE TO PORT 60h WAS TRAPPED. 1 = A WRITE TO PORT 64h WAS TRAPPED. |
| 13 | R | RESERVED: THESE BITS ALWAYS RETURN 0. |
| 12 | KEYDWN | REFLECTS THE CURRENT STATE OF THE LOGICAL NAND OF THE KEYBOARD MATRIX INPUT PINS, (I.E., IF ENKBD=001), A LOW ON ANY OF THE INPUT PINS WILL CAUSE KEYDWN = 1, OTHERWISE KEYDWN = 0. |
| 11:8 | R | RESERVED: THESE BITS ALWAYS RETURN TO 0. |
| 7 | SIDLE | SERIAL INTERFACE IN IDLE STATE |
| 6 | SRTO | SERIAL INTERFACE RECEIVE TIME-OUT OCCURRED |
| 5 | STTO | SERIAL INTERFACE TRANSMIT TIME-OUT OCCURRED |
| 4 | SRCV | SERIAL INTERFACE 11-BIT WORD WAS RECEIVED |
| 3:0 | R | RESERVED: THESE BITS ALWAYS RETURN 0. |

FIG. 4

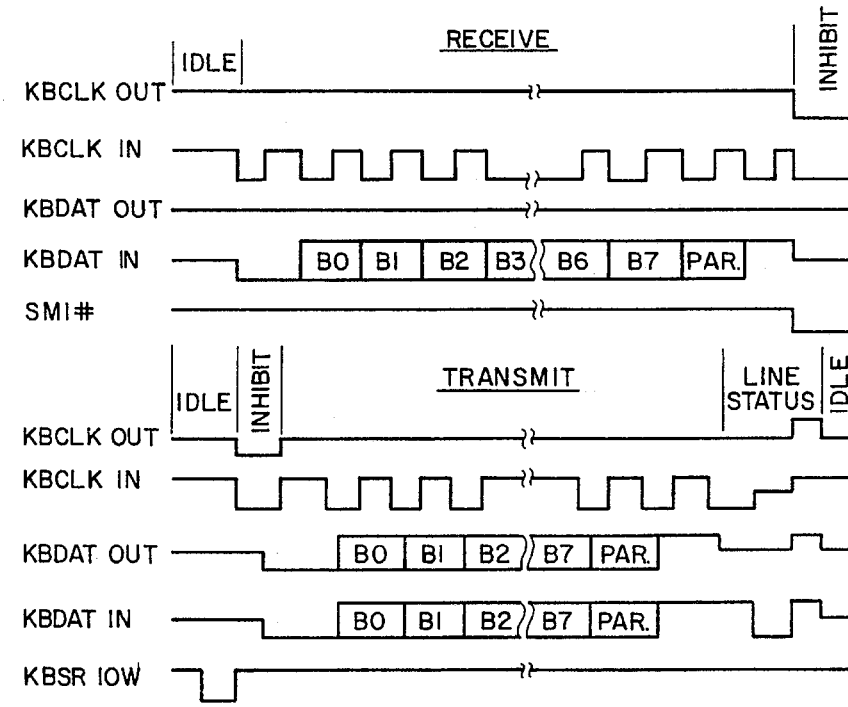

FIG. 6

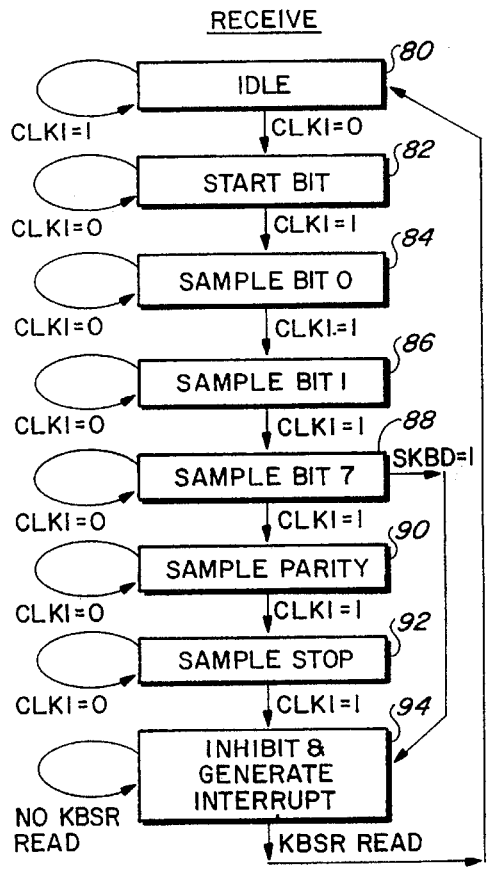
FIG. 7
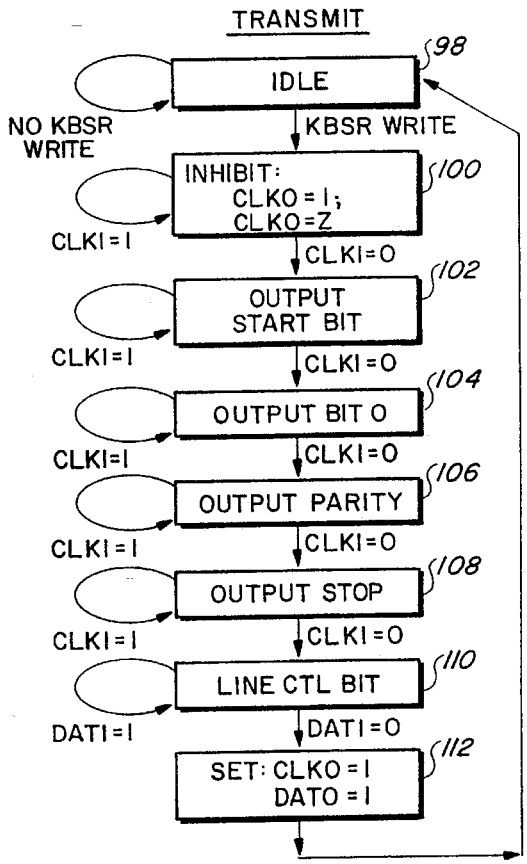
FIG. 8
| CONFIG PORT | D15 | D14 | D13 | D12 | D11 | D10 | D9 | D8 |
|---|---|---|---|---|---|---|---|---|
| KBIN | KBIN[15:8] | | | | | | | |
| POR VALUE (NOTE) | X | X | X | X | X | X | X | X |
| | D7 | D6 | D5 | D4 | D3 | D2 | D1 | D0 |
| | KBIN[7:0] | | | | | | | |
| | X | X | X | X | X | X | X | X |
| BIT | NAME | FUNCTION |
|---|---|---|
| 15:0 | KBIN[15:0] | INPUT DATA FROM KEYBOARD MATRIX |
KBIN - KEYBOARD INPUT DATA (R-O)
FIG. 9

EXTERNAL SCANNER WITH X-BUS INTERFACE

| MATRIX PIN NAME | CONTROLLER PIN | | |
|---|---|---|---|
| | NAME | TYPE | FUNCTION |
| KBIN [15] | EXTKBC | OUTPUT | 14.318 MHz/2 |
| KBIN [14] | KBINT | INPUT WITH PULL-DOWN | EXTERNAL INTERRUPT, MAPPED TO KEYBOARD SMI |
| KBIN [13:10] | | | OPTIONAL EXTERNAL RTC INTERFACE |
| KBIN [9:4] | | | NOT USED |
| KBIN [3] | XA2 | OUTPUT | I/O ADDRESS LINE A[2] |
| KBIN [2] | IOW# | OUTPUT | I/O WRITE STROBE |
| KBIN [1] | IOR# | OUTPUT | I/O READ STROBE |
| KBIN [0] | KBCS# | OUTPUT | KEYBOARD CONTROLLER CHIP SELECT |
| KBOUT[7:0] | XD[7:0] | I/O | BIDIRECTIONAL DATA BUS |

*Fig. 10*

EXTERNAL SCANNER WITH SERIAL INTERFACE

| MATRIX PIN NAME | CONTROLLER PIN | | |
|---|---|---|---|
| | NAME | TYPE | FUNCTION |
| KBIN [15:14] | | | NOT USED |
| KBIN [13:10] | | | OPTIONAL EXTERNAL RTC INTERFACE |
| KBIN [13:12] | | | NOT USED |
| KBIN [11] | MSDAT | I/O WITH 10k PULL-UP | BIDIRECTIONAL SERIAL MOUSE DATA |
| KBIN [10] | MSCLK | I/O WITH 10k PULL-UP | BIDIRECTIONAL SERIAL MOUSE CLOCK |
| KBIN [9] | KBDAT | I/O WITH 10k PULL-UP | BIDIRECTIONAL SERIAL DATA |
| KBIN [8] | KBCLK | I/O WITH 10k PULL-UP | BIDIRECTIONAL SERIAL CLOCK |
| KBIN [7:0] | | | NOT USED |
| KBOUT[7:0] | | | NOT USED |

*Fig. 11*

EXTERNAL RTC INTERFACE

| MATRIX PIN NAME | CONTROLLER PIN | | |
|---|---|---|---|
| | NAME | TYPE | FUNCTION |
| KBIN [13] | RTCIRQ# | INPUT WITH PULL-UP | EXTERNAL RTC INTERRUPT |
| KBIN [12] | RTCDS | OUTPUT | EXTERNAL RTC DATA STROBE |
| KBIN [11] | RTCAS | OUTPUT | EXTERNAL RTC ADDRESS STROBE |
| KBIN [10] | RTCRW | OUTPUT | EXTERNAL RTC READ/WRITE # LINE |
| KBOUT [7:0] | XD[7:0] | I/O | BIDIRECTIONAL DATA BUS |

*Fig. 12*

MULTI-PURPOSES KEYBOARD INTERFACE

BACKGROUND

Keyboard interfaces are utilized to interconnect the keyboard of a computer, such as a personal computer (PC), and the central processing unit (CPU) of the computer itself. Typically, keyboard interfaces are designed for interfacing between one specific type of keyboard configuration and the computer. In the past, a separate micro-controller typically has been employed, along with selected gates for effecting this interface. A standard universal or multi-purpose keyboard interface for all types of keyboards, however, has not existed.

The standard desk-top DOS computer uses a serial keyboard having a large number of dedicated keys on it. Thus, the serial signals supplied by this keyboard are interfaced with the computer by a suitable keyboard interface system designed to operate with the serial output of the keyboard. The serial keyboard interface typically used implements a micro-controller to create a data stream and control the interrupting mechanism. Portable computers, however, typically use a keyboard with fewer keys than the desk-top serial keyboard. To permit all of the functions and other alphanumeric signals to be obtained from such a keyboard having a reduced number of keys, a matrix keyboard system is employed. In a matrix keyboard, simultaneous operation of various key combinations provides a unique set of signals, which then are combined to produce the desired operating signals to the CPU of the computer. Keyboard interfaces designed to operate with a matrix keyboard necessarily have been designed to operate differently from serial keyboard interfaces. In addition, bus interfaces to a micro-controller also have been employed as the interface between a keyboard and the CPU of the computer. In all cases, it is necessary to provide an interface which is DOS compatible from a BIOS/DIOS programmer's point of view.

Use of a separate micro-controller in the keyboard interface, along with the necessary gates to effect the interface, requires a relatively large size die, and is relatively expensive. Such expense is particularly significant when the requirement for a separate or different keyboard interface for matrix keyboards, as well as earlier IBM PC/AT computers is considered. Manufacturers of keyboard interfaces have been required to design and stock different interfaces for each of these applications; and computer manufacturers also have been required to use different keyboard interfaces for different types of personal computers, as described above.

It is desirable to provide a single, multi-function keyboard interface which may be used to connect a CPU to a standard serial keyboard, a matrix keyboard, or a bus interface to a micro controller.

SUMMARY OF THE INVENTION

Accordingly, it is an object of this invention to provide an improved keyboard interface system.

It is another object of this invention to provide an improved multi-purpose keyboard interface system.

It is an additional object of this invention to provide an improved multi-purpose keyboard interface system capable of providing an interface between either a serial keyboard or a matrix keyboard and the CPU of a computer.

It is a further object of this invention to provide an improved multi-purpose keyboard interface system which requires reduced hardware and which utilizes software-controlled keyboard read/write capabilities instead of relying on dedicated hardware.

In accordance with a preferred embodiment of this invention, a multi-purpose keyboard controller for interfacing different keyboard types with a computer includes separate control circuits for each of the different keyboard types with which the system operates. Computer interface logic is programmed to select the specific control circuit for utilization in a particular system and addresses the selected system to supply signals to and receive signals from the selected control circuit utilizing built in SMI interrupting mechanism for reading/writing the keyboard or capturing key press events.

BRIEF DESCRIPTION OF THE DRAWINGS

FIGS. 3, 4 and 5 are charts employed in understanding the operation of the embodiment shown in FIGS. 1 and 2;

FIG. 6 is a timing diagram used in explaining the operation of the embodiment shown in FIGS. 1 and 2;

FIG. 7 is a state block diagram of the system of FIG. 2 in a receive mode of operation;

FIG. 8 is a state block diagram of the system of FIG. 2 in a transmit mode of operation; and FIGS. 9, 10, 11 and 12 are charts employed in understanding the operation of the preferred embodiment of the invention.

DETAILED DESCRIPTION

Figure 1:
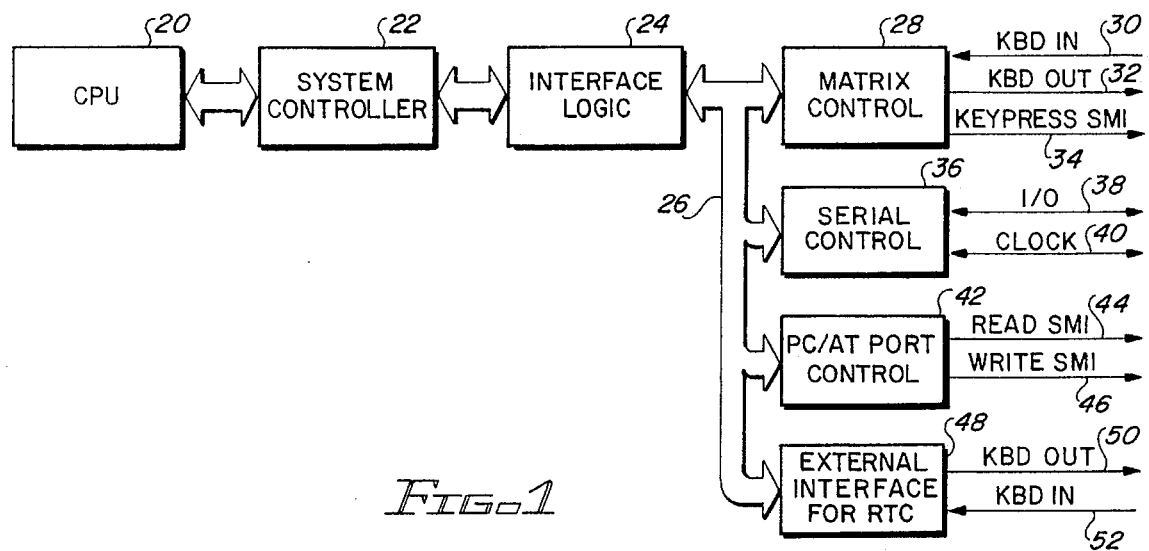
FIG. 1 is a block diagram of a preferred embodiment of the invention.

Reference now should be made to the drawings, in which the same reference numbers are used throughout the different figures to designate the same components. FIG. 1 is a block diagram representation of a preferred embodiment of the invention. The circuit shown in FIG. 1 includes a CPU 20 of the type used in a standard desk-top or portable personal computer, and which is interconnected by a bus to a system controller 22 of standard configuration. The system controller 22, in turn, is interconnected by a bus to interface logic 24 to provide data to, and receive data from, the interface logic 24, along with control signals for operating the system. This portion of the system shown in FIG. 1 is conventional; and the interconnections between the CPU 20, system controller 22, and interface logic 24 are conventional.

The output of the interface logic 24 then is interconnected by a data bus 26, which typically is 80 bits wide, to four control circuits 28, 36, 42 and 48. Together these control circuits operate as a multi-purpose keyboard controller which is capable of supporting matrix keyboards under the control of the matrix control 28, a serial keyboard under the control of the serial control circuit 36, and a PC/AT port control circuit 42 and an external interface 48 for real time clock (RTC).

Typically, the matrix keyboard (not shown) which is connected to the matrix control circuit 28 is a 16×8 matrix keyboard; and the input signals from the keyboard are applied on a bus 30 and the output signals from the control circuit 28 are supplied on a keyboard out bus 32. The system is designed to operate on SMI (system management interruption) interrupts and the key press SMI signals are applied over the lead 34. It should be noted that the matrix control circuit 28 includes logic which support key press (up and down) interrupts, and which are supplied through the interface logic 24 and system controller 22 to the CPU 20. The matrix control circuit 28 also includes logic which stores the value being pressed by a standard scanning mode.

The serial keyboard control 36 utilizes a standard IBM PS/2 two-wire interface to transmit the data. This is done in an asynchronous fashion, however; so that the keyboard control logic can support the serial stream at a range up to four Mhz. By doing this, the serial control circuit 36 is flexible to adapt to many different keyboard manufacturer's timing requirements. As illustrated in FIG. 1, the input/output (I/O) information is supplied over a lead 38; and the clock information to and from the serial controller interconnecting with the serial keyboard (not shown) is applied over a lead 40. Again, standard SMI interrupts to the processor are used to read/write the values from the CPU to the keyboard and from the keyboard back to the CPU, eliminating the need for dedicating a special hardware interrupt level and additional gates.

The PS/AT port control circuit 42 also remains compatible with the rest of the system through the interface logic 24, which employs software control to select the circuit 42 when a PC/AT computer is used for the CPU 20 and is connected to a corresponding keyboard (not shown). As noted in FIG. 1, the read SMI signals are applied over a lead 44, and the write SMI signals are applied over a lead 46, which interfaces the control circuit 42 with the keyboard of the PC/AT standard computer, via the ports 60 and 64 employed for this purpose.

If desired, an optional micro controller may be accessed through the control circuit 48 via a five-pin control and eight-pin address/data bus multiplexed on the 16 and 8 pin matrix keyboard pins. The keyboard out information is applied over a lead 50; and the keyboard in information is applied over a lead 52, as illustrated in FIG. 1.

The interrupt scheme used by all of the circuits 28, 36, 42 and 48 of the keyboard interface employs SMI interrupts to the processor 20 and uses SMI based software routines to read/write the values to and from the selected keyboard, which is controlled through the selected one of the circuits 28, 36, 42 or 48. This eliminates the need for dedicating a special hardware interrupt level; so that the entire keyboard controller system is compatible with the well-known DOS PC/AT port 60/64h software interface. The result is that the keyboard interface, through all of the control circuits 28, 36, 42 and 48 emulates the PC/AT port 60/64h interface from one of three built in interfaces, a standard 16 ×8 matrix keyboard interface at the matrix control 28, a standard serial keyboard interface at the serial control circuit 36, and an external bus connection to a micro controller at the interface 48. By utilizing SMI driven software routines with the serial keyboard interface, the entire interface system allows a small hardware size design with maximum flexibility.

Figure 2:
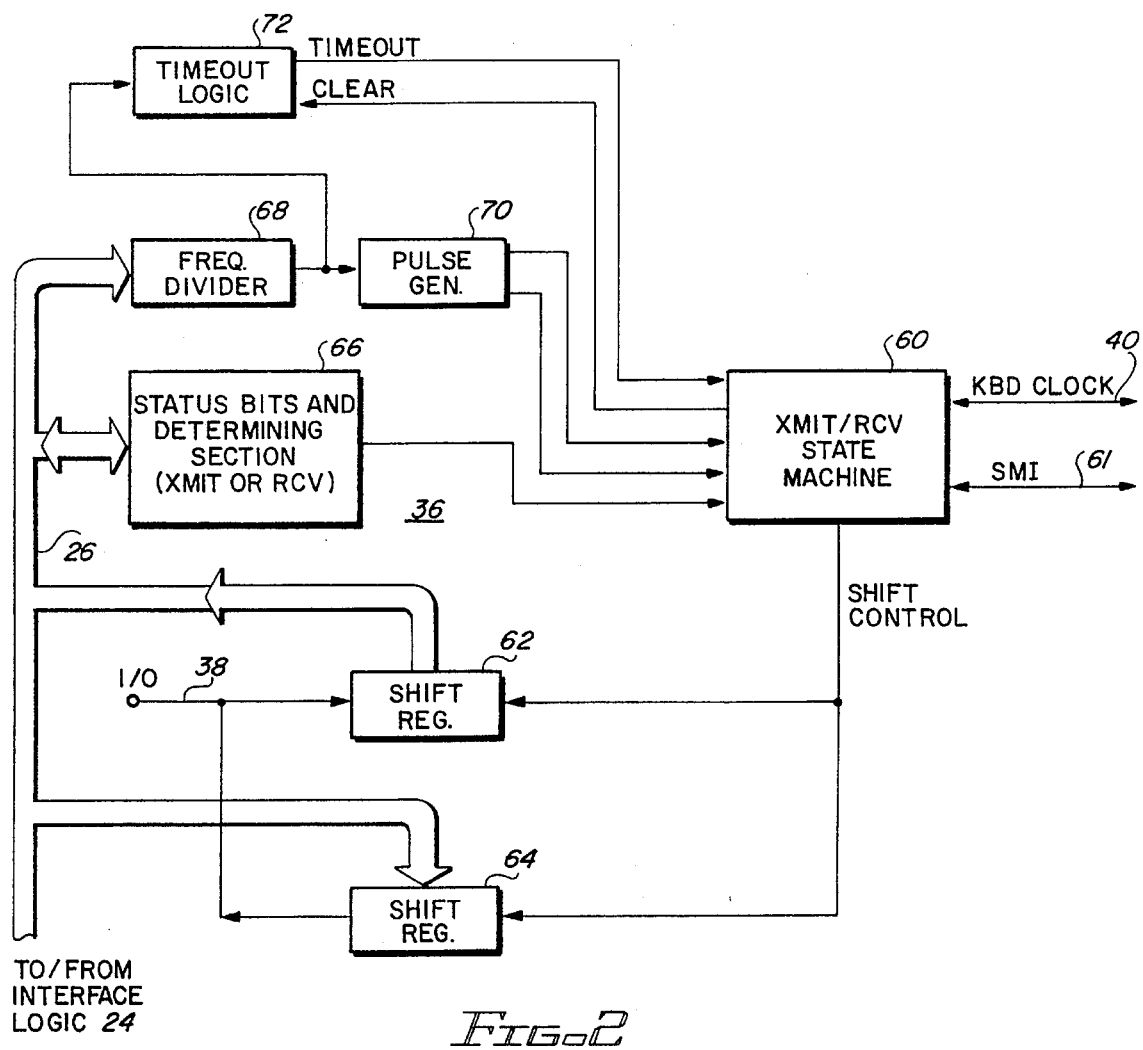
FIG. 2 is a more detailed block diagram of a portion of the embodiment shown in FIG. 1.

FIG. 2 is a detailed block diagram of the serial control circuit 36 for interfacing between the logic 24 and a serial keyboard in order to provide the SMI drive signals. At the heart of the serial control circuit 36 shown in FIG. 2 is a transmit/receive state machine 60. This machine interfaces with the keyboard clock 40, shown in FIG. 1, and also provides SMI signals to and from the keyboard (not shown) on the lead 61.

The basic timing signals for operating the interface circuit 36 (as well as the circuits 28, 42 and 48) are obtained from the interface logic over the bus 26, and are supplied to a frequency divider 68. Typically, the clock signals are selected to be at a frequency which divides down to 16.35 Khz (60 output of the frequency divider 68 then is supplied to a pulse generator 70, which supplies two outputs to the transmit/receive state machine 60. One of the outputs is a rising edge pulse and the other is a falling edge pulse for each of the timing signals obtained from the frequency divider 68. Thus, the basic operation of the keyboard clock 40 on the state machine 60 is controlled by the pulse generator 70.

The output of the frequency divider 68 also is supplied to a timeout logic circuit 72, which supplies timeout signals to the state machine 60 and which receives clear signals from the state machine 60. The timeout logic operates to provide a timeout signal or pulse and to receive clear pulses coordinated with the asynchronous operation of the keyboard, attached to the state machine 60; so that asynchronous operation may be effected.

The state machine 60 further controls the operation of two shift registers 62 and 64, with the shift register coupled to receive input signals from the I/O lead 38 constituting the data from the external serial keyboard; and the shift register 64 supplies data out to the external keyboard on the I/O lead 38 under control of shift signals supplied to the shift registers 62 and 64 from the state machine 60. The output of the incoming data from the shift register 62 is supplied in parallel from the shift register 62 through the bus 26 to the interface logic 24 for utilization by the CPU 20. Similarly, control signals from the interface logic 24 are supplied through the bus 26 to the shift register 64, from which these signals are serially shifted out on the input/output lead 38 to effect conventional control of the serial keyboard to which the control circuit 36, shown in FIG. 2, is connected.

The circuit of FIG. 2 functions to emulate ports 60 and 64 (the standard PC/AT ports) with SMI hooks in any keyboard mode. The conventional mode for a matrix keyboard is to respond to SMI signals, as is the operation of the PC/AT keyboard, illustrated in FIG. 1 as controlled by the control circuit 42. By causing the serial control circuit 36 also to act with SMI signals, a simple software (BIOS) set-up for addressing or selecting the desired one of the circuits 28, 36, 42 and 48 from the interface logic 24 enables the system to have a software emulated mode which resembles a serial keyboard, when the serial control circuit 36 is selected, but which operates by emulating the SMI port 60/64h SMI access.

The system which is shown in FIGS. 1 and 2 operates in a scan mode, which is purely software driven from a 16 bit input on the bus 26 from the interface logic 24 to 8 outputs to address appropriate lookup tables in the control circuits 28, 36, 42 and 48 to effect the desired operation. When this takes place, the CPU 20 functions in a conventional manner irrespective of the control circuit and keyboard arrangement which is used. It should be noted that, with the exception of the simultaneous operation of the serial control circuit 36 (coupled with a serial keyboard, not shown) and the RTC interface 48, the other control circuits 28 and 42 only can be operated one at a time, exclusive of the other control circuits.

Reference now should be made to FIG. 3, which illustrates the keyboard control configuration register for emulating the PC/AT standard port 60/6h interface. A standard 8 ×16 matrix keyboard interface is software scanned by the interface logic 24, and uses no external scanner/controller. Direct connection of an external keyboard scanner/controller is accomplished by changing the configuration of the pins to an X-bus-like interface. Connection to an external keyboard scanner also may be done via a standard bi-direction data/clock serial interface. The external scanner configuration also allows connections to an external real time clock (RTC) controller, as indicated for the control circuit 48 in FIG. 1.

The registers which are shown in FIG. 3 are higher level system control and configuration registers, as well as the keyboard matrix scan ports which support the emulated registers. There is no dedicated power control for the external keyboard logic. Any suitable signal can be used for this purpose.

The keyboard control configuration register of FIG. 3, provided as part of the interface logic 24, allows setting various enable functions for the keyboard port and setting output data to the keyboard matrix. If the keyboard is enabled, the selected interface interrupt will assert the SMI output to the power management unit (PMU), otherwise the SMI output is held low. The enable keyboard (ENKBD) field in the keyboard control (KBDCTL) register has values that do not use all of the keyboard interface pins supplied by the bus 26. Unused pins are configured to general purpose input/outputs (GPIO's) controlled by registers in the PMU.

As is apparent from an examination of FIG. 3, the 16 bits for the configuration of a keyboard include bits for the keyboard configuration (15:8) and for the keyboard output (7:0). The functions of the various bits are indicated on the chart. As is readily apparent, the enable keyboard bits 15:13 are used to enable the interface, consisting of the circuits 28, 36, 42 and 48 in FIG. 1, and to select the options, that is which of these circuits is to be enabled for operation with and interaction with the CPU 20 of FIG. 1. By encoding these three bits in the BIOS software employed by the interface logic 24, the CPU 20 is connected with the appropriately selected control circuit 28, 36, 42 and 48 shown in FIG. 1. Bits 12:8 are encoded in accordance with the table of FIG. 3, as indicated, for controlling the current state of the interrupt output and, for use with a matrix keyboard interface via circuit 28, to determine whether the rising edge of a key down or the falling edge of a key down detection is used to generate the SMI signal. Bit 8 is used to determine the serial interface in the PC/AT mode of operation. Finally, as shown in FIG. 3, bits 7:0 are used for the output data from the selected control circuit 28, 36, 42 or 48 to the keyboard matrix.

Reference now should be made to FIG. 4, which illustrates the keyboard status (KBDSTAT) configuration register, which allows setting various enable functions for the keyboard port and accessing current keyboard scanner status. Again, this is done with a 16 bit access, some of which bits are reserved (as indicated in FIG. 4). The other bits provide the information indicated on FIG. 4. As is indicated in FIG. 4, the keyboard emulation port is accessed via internally decoded port 60h and port 64h input/output (I/O) reads or writes. Both ports physically exist as simple 8 bit read/write registers. The PC/AT logic is emulated via appropriate SMI I/O trap generation, software, and appropriate IRQ generation. Together, the two registers and the emulation provide a PC/AT compatible method of accessing the keyboard matrix, irrespective of which type of physical keyboard is employed to interface with the computer, including the CPU 20 shown in FIG. 1.

If the keyboard I/O read trap is enabled, then any read from port 60h will generate an SMI I/O read trap. If the keyboard I/O write trap is enabled, then any writes to port 60h or 64h will generate an SMI I/O write trap and set the WR 60 or WR 64 bit in the keyboard status register (not shown) of the system in FIG. 1. The state of the internal interrupt request (IRQ) is controlled by software via the keyboard control register in the interface logic 24. Due to keyboard I/O traps being generated while SMI is active, software in the system controller 22 and interface logic 24 is designed to complete keyboard processing prior to clearing the keyboard I/O read or write trap status.

To permit asynchronous control of the serial keyboard controlled by the control circuit 36 of the interface logic, the shift registers 62 and 64, described above in conjunction with FIG. 2, are employed. FIG. 5 illustrates the configurations of both of these registers (each are configured the same). It should be noted that the keyboard shift register (KBSR), shown as registers 62 and 64 in FIG. 2, allows reading input data from the shift register or sending output data to the shift register under control of a state machine 60 clocked by a derivative of the system clock received from the interface logic 24 as described above. Also as described above in conjunction with the circuit of FIG. 2, the period of the clock from the frequency divider 68 is equal to or greater than 60 microseconds. The format of the shift register words are shown in FIG. 5.

Reference now should be made to FIG. 4 in conjunction with the state machines shown in FIG. 7 and 8 and the timing diagram of FIG. 6. FIG. 6 shows a timing clock diagram for the serial control circuit 36 of FIGS. 1 and 2 for both the receive and transmit modes of operation. The idle state of the interface is with keyboard clock (KBCLK) and keyboard data (KBDAT) as inputs and at a logic high. As indicated in the state machines of FIGS. 7 and 8 and as shown in the timing diagram of FIG. 6, this logic high sets a "request to send" status on the interface. The inhibit state of the interface is with KBCLK output driven low. The inhibit state causes an abort of any current operation by the keyboard scanner, and prevents the start of any new operation. Any interface state must exist for at least 60 microseconds to be recognized by the keyboard.

As shown in FIG. 7, the receive operation is initiated in the idle state 80 by the KBCLK input going low. To receive data from a serial keyboard, the rising edge of KBCLK clocks data into bit 10 of the shift register 62. The first bit is a start bit at 82 followed by the first data bit at 84 in FIG. 7. Each subsequent bit, shown at 86 and at 88, is clocked into the shift register in the same manner. The state diagram of FIG. 7, however, does not show all of these bits, but instead jumps from bit 1 at 86 to bit 7 at 88, in order to conserve space in the state machine which is diagrammed in FIG. 7. It should be noted, however, that each of these bits is clocked in the same manner as indicated for the ones shown in FIG. 7. Following completion of the shifting of the 8 data bits into the register 62 by the state machine 60 illustrated in detail in FIG. 7, the parity bit and stop bits are added at 90 and 92 to complete the 11 bit byte representative of a key operation in the serial keyboard to which the control circuit 36 is connected. After the eleventh rising edge of the KBCLK, the inhibit state is entered at 94 and one state time later, a keyboard SMI is generated on the lead 61 from the state machine 60, as shown in FIG. 2. The interface remains in the inhibit state 94 until the keyboard status SMI status is cleared. The KBCLK output then is driven high and the interface is returned to the idle state 80, as shown in FIG. 7. If more than two Microseconds occur between successive rising edges of KBCLK, a timeout occurs and the interface is taken to the inhibit state 94, the timeout status is set, and a keyboard status SMI is generated.

FIG. 8 shows the state machine operation for the transmit operation of a serial keyboard under control of the serial control circuit 36. A transmit operation is initiated by a write to the MSB of the KBSR register 64 (FIG. 2). This forces the interface from the idle state 98 to the inhibit state 100 by driving the KBCLK output low, as indicated in FIG. 8. To initialize for data transmission, KBCLK is then made an input and pulled up by the internal pull-up; and KBDAT is made an output. The falling edge of KBCLK then clocks data out of bit 0 of the shift register 64. After the eleventh falling edge of KBCLK passing through the start bit 102 and output data bits 0 to 8 (indicated in FIG. 8 as block 104 for bit 0 only, to avoid unnecessary repetition) and clocking of the output parity bit 106 and output stop bit 108, all of the data is clocked out of the 0 stage of the shift register 64 and supplied to the input/output lead 38, shown in FIGS. 1 and 2. After the eleventh falling edge of KBCLK, a completion sequence is generated, namely KBDAT which is driven high by the stop bit. This completion sequence is made an input and it is monitored for a low state. After KBDAT goes low, KBCLK and KBDAT are both made outputs at 112 and pulled up for a length of time sufficient to raise them to logic "1". Finally, the idle state at 98 is entered. If more than two Microseconds occur between successive falling edges of KBCLK, a timeout occurs, as controlled by the timeout logic 72 of FIG. 2, and the interface is taken to the inhibit state 100, the timeout status is set, and a keyboard status SMI is generated.

Reference now should be made to FIG. 9, which is an illustration of the configuration for the keyboard matrix interface selected by the matrix control circuit 28 when a matrix keyboard is employed with the CPU 20. FIG. 9 illustrates the keyboard input data (KBIN) for a matrix keyboard. The keyboard matrix interface consists of 8 outputs and 16 inputs applied to the matrix over the bus 26 from the interface logic 24. The inputs are designed with weak pull-ups. The outputs have weak high drive and normal low drive. The weak high drives of the outputs prevent a short if more than one key is pressed. Output data is sent via the KBDCTL register shown above in FIG. 3. The KBIN register shown in FIG. 9 allows accessing input data from the keyboard matrix of a matrix keyboard attached to the matrix control via the leads 30, 32 and 34 shown in FIG. 1. In the illustration of FIG. 9, it should be noted that "X" signifies the POR value of the corresponding pin of the 16 inputs. The key-down status signal is a logical NAND of KBIN inputs. If all of the KBOUT outputs are set to 0's, then the KBIN inputs all will be 1's until any key is pressed. When a key is pressed, one of the inputs goes low, and causes the key-down status to go true. If the key-down SMI is enabled, then the rising edge of the key-down status signal generates a keyboard SMI. If the key-up SMI is enabled, then the falling edge of the key-down status signal generates a keyboard SMI. This is in accordance with the keyboard control information discussed previously in conjunction with FIG. 3.

FIG. 10 illustrates the external interface for RTC 48 shown in FIG. 1. When the external scanner with X-bus interface is enabled, the 24 pins from the keyboard matrix interface are configured as shown in the table of FIG. 10. The not-used pins are configured to be GPIO's controlled by registers in the PMU. It should be noted that a keyboard status SMI signal is generated by the rising edge of KBINT. 10W# and 10R# are copies of the internal 10W# and 10R# during internal I/O address codes of 0090h and 0094h. The XD[7:0]bus direction is out except when 10 R# is active. The 10R# and 10W# strobes have a number of wait states fixed at eight cycles, (that is 16 periods of CLK2).

The external interface 48 also may be used with an external scanner with a serial interface. When this is done, the controller pins and matrix pins are configured as shown in FIG. 11. The serial clock and data pins are connected to an eleven bit shift register that sends and receives the entire 11 bit word to and from the controller in the manner described above in conjunction with FIG. 2. The keyboard shift register allows sending output data or reading input data from the shift register on control of the state machine 60, as described in conjunction with FIG. 2 above. Typically, an external scanner with a serial interface is not employed, and instead the serial control circuit 36 is used to interconnect with a serial keyboard. In situations, however, where an external scanner is in existence, the system is configured through the interface 48, as shown in conjunction with FIG. 11 to permit a "universal" keyboard interface system to exist.

An additional interface for the circuit 48 is in conjunction with an external real-time clock (RTC). Any time one of the external scanner interfaces of the circuit 48 is enabled, the RTC interface optionally may be enabled. This uses 12 pins from the keyboard matrix interface configured as shown in the table of FIG. 12. If the external RTC is not enabled when one of the external scanner interfaces is enabled, the KBIN [13:10] pins are configured to be GPIO's controlled by registers in the PMU. The controller pins, the types and the functions are clearly shown in FIG. 12 and permit operation of the system with an external RTC interface.

The foregoing description of the preferred embodiment of the invention is to be considered as illustrative and not as limiting. Various changes and modifications will occur to those skilled in the art for performing substantially the same function, in substantially the same way, to achieve substantially the same results without departing from the true scope of the invention as defined in the appended claims.

What is claimed is:

1. A multi-purpose keyboard controller for interfacing different keyboard types with a computer including in combination:

a scanning matrix keyboard control circuit;

a serial keyboard control circuit;

a computer interface logic circuit coupled to said control circuits and programmed to selectively operate one of said control circuits to receive signals from said computer interface logic circuit and to supply signals to said computer interface logic circuit, with the non-selected one of said control circuits being rendered non-responsive and wherein said control circuits produce system management interruption (SMI) signals to said computer interface logic circuit for utilization thereby, irrespective of which control circuit is selectively operated by said logic circuit.

2. The combination according to claim 1 further including at least one additional external control circuit selectively operated by said computer interface logic circuit.

3. The combination according to claim 1 wherein said control circuits use SMI interrupts to said interface logic circuit and SMI software routines are utilized by said logic circuit to read and write values to and from keyboards coupled with said respective keyboard control circuits.

4. The combination according to claim 1 wherein said serial keyboard control circuit includes a state machine for asynchronously operating a keyboard connected thereto when said serial keyboard control circuit is selectively operated by said computer interface logic circuit.

5. The combination according to claim 4 wherein said serial keyboard control circuit includes an incoming shift register for receiving data from a keyboard attached to said serial keyboard control circuit and an output shift register for transmitting data to a serial keyboard attached to said serial keyboard control circuit, with operation of said shift registers controlled by said state machine.

6. The combination according to claim 4 wherein said state machine generates SMI interrupt signals corresponding to operation of a serial keyboard connected thereto.

7. The combination according to claim 6 wherein said serial keyboard control circuit includes an incoming shift register for receiving data from a keyboard attached to said serial keyboard control circuit and an output shift register for transmitting data to a serial keyboard attached to said serial keyboard control circuit, with operation of said shift registers controlled by said state machine.

* * * * *